US006614270B2

(12) United States Patent
Okamoto et al.

(10) Patent No.: US 6,614,270 B2
(45) Date of Patent: Sep. 2, 2003

(54) POTENTIAL DETECTING CIRCUIT HAVING WIDE OPERATING MARGIN AND SEMICONDUCTOR DEVICE INCLUDING THE SAME

(75) Inventors: Mako Okamoto, Hyogo (JP); Yasuhiko Taito, Hyogo (JP); Fukashi Morishita, Hyogo (JP); Akira Yamazaki, Hyogo (JP); Mihoko Akiyama, Hyogo (JP); Nobuyuki Fujii, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/809,212

(22) Filed: Mar. 16, 2001

(65) Prior Publication Data

US 2002/0047731 A1 Apr. 25, 2002

(30) Foreign Application Priority Data

Oct. 19, 2000 (JP) ........................................ 2000-319226

(51) Int. Cl.[7] ................................................. H03K 5/22
(52) U.S. Cl. ................................ 327/77; 53/89; 53/206
(58) Field of Search ............................... 327/50–52, 74, 327/72, 77, 80, 85, 89, 535, 540, 541, 205, 206, 68, 88, 53, 560–563; 365/184, 185.21, 207, 208; 330/252, 253, 257, 288

(56) References Cited

U.S. PATENT DOCUMENTS

| 5,347,170 | A | * | 9/1994 | Hayakawa et al. | .......... 327/541 |
| 5,862,091 | A | * | 1/1999 | Bion et al. | .................. 365/207 |
| 5,929,679 | A | * | 7/1999 | Ohwada | ..................... 327/206 |
| 6,104,216 | A | * | 8/2000 | Satoh | ........................... 327/78 |
| 6,297,671 | B1 | * | 10/2001 | Shih et al. | ..................... 327/74 |

FOREIGN PATENT DOCUMENTS

| JP | 7-296583 | 11/1995 |
| JP | 11-312392 | 11/1999 |

OTHER PUBLICATIONS

"Ultra LSI Memory", by Kiyoo ITO, Advanced Electronics Series (Nov. 5, 1994), pp. 310–322.

* cited by examiner

*Primary Examiner*—Minh Nguyen
(74) *Attorney, Agent, or Firm*—McDermott, Will & Emery

(57) ABSTRACT

In a detector included in a VPP generating circuit in a DRAM, an external power supply potential is applied to the gate of an N-channel MOS transistor for regulating a through current of an inverter for outputting an inversion signal of an output signal of a comparator. Since a drain-source voltage of the N-channel MOS transistor can be set to be lower than a threshold voltage Vthn of the N-channel MOS transistor, an operation margin of the detector under conditions of a low voltage and a low temperature is made wider as compared with a conventional technique.

18 Claims, 11 Drawing Sheets

POTENTIAL DETECTING CIRCUIT HAVING WIDE OPERATING MARGIN AND SEMICONDUCTOR DEVICE INCLUDING THE SAME

BACKGROUND OF THE INVENTION

1. Field of the Invention

The present invention relates to a potential detecting circuit and, more particularly, a potential detecting circuit for detecting whether a potential at a predetermined node is higher than a reference potential or not.

2. Description of the Background Art

Conventionally, a dynamic random access memory (hereinbelow, called a DRAM) is provided with a VPP generating circuit for generating a boosted potential VPP higher than an external power supply potential VCC by an amount equal to or higher than a threshold voltage Vthn of an N-channel MOS transistor. The VPP generating circuit is provided with a detector for detecting whether the boosted potential VPP is higher than a target potential or not.

FIG. 15 is a circuit diagram showing the configuration of such a detector 90. In FIG. 15, the detector 90 includes P-channel MOS transistors 91 to 93, N-channel MOS transistors 94 to 98, and inverters 99 to 101. The P-channel MOS transistors 91 and 92 and the N-channel MOS transistors 94 to 96 construct a comparator 102. The P-channel MOS transistors 91 and 92 are connected between a line of the external power supply potential VCC and nodes N91 and N92, respectively. The gates of the P-channel MOS transistors 91 and 92 are connected to the node N91. The P-channel MOS transistors 91 and 92 construct a current mirror circuit. A signal appearing at the node N92 is an output signal φC of the comparator 102. The N-channel MOS transistor 94 is connected between the node N91 and a node N96, and the N-channel MOS transistor 95 is connected between the node N92 and the node N96. The gates of the N-channel MOS transistors 94 and 95 receive a reference potential VR and a partial potential VD, respectively. The partial potential VD is a potential obtained by dividing the boosted potential VPP at a predetermined voltage dividing rate, and is set to reach the reference potential VR when the boosted potential VPP reaches the target potential. The N-channel MOS transistor 96 is connected between the node N96 and a line of the ground potential GND and its gate receives the external power supply potential VCC. The N-channel MOS transistor 96 serves as a resistive element.

When the partial potential VD is lower than the reference potential VR, a current passing through the MOS transistors 91, 92, and 94 is larger than that passing through the N-channel MOS transistor 95, and the signal φC is at the "H" level (external power supply potential VCC). When the partial potential VD is higher than the reference potential VR, the current passing through the MOS transistors 91, 92, and 94 is smaller than the current passing through the N-channel MOS transistor 95, and the signal φC is at the "L" level (source potential VSC of the N-channel MOS transistors 94 and 95).

The P-channel MOS transistor 93 and the N-channel MOS transistors 97 and 98 construct an inverter 103. The MOS transistors 93, 97, and 98 are connected in series between the line of the external power supply potential VCC and the line of the ground potential GND. Each of the gates of the MOS transistors 93 and 97 receives the signal φC. A node between the MOS transistors 93 and 97 is an output node N93 of the inverter 103. The gate of the N-channel MOS transistor 98 is connected to the drain of the same transistor. The N-channel MOS transistor 98 serves as a diode. The threshold potential of the inverter 103 is set to an intermediate level between the external power supply potential VCC and the source potential VSC of the N-channel MOS transistors 94 and 95 by the N-channel MOS transistor 98.

When the signal φC is at the "H" level, the P-channel MOS transistor 93 is nonconductive, the N-channel MOS transistor 97 is conductive, and the node N93 is at the "L" level (the source potential VSI of the N-channel MOS transistor 97, that is, the threshold potential Vthn of the N-channel MOS transistor 98). When the signal φC is at the "L" level, the N-channel MOS transistor 97 is nonconductive, the P-channel MOS transistor 93 is conductive, and the node N93 is at the "H" level (external power supply potential VCC).

A signal appearing at the node N93 is a signal φEN obtained by being inverted by the inverters 99 to 101. When the signal φEN is at the "L" level, the boosted potential VPP is higher than the target potential. When the signal φEN is at the "H" level, the boosted potential VPP is lower than the target potential. Consequently, by adjusting the boosted potential VPP on the basis of the signal φEN, the boosted potential VPP can be held at the target potential.

In a semiconductor integrated circuit device such as a DRAM, the size and the power supply voltage of the MOS transistor are being reduced. The reason why the power supply voltage is being reduced is that, as the MOS transistor becomes finer, the withstand voltage of the MOS transistor decreases.

In the detector 90 shown in FIG. 15, however, when the external power supply potential VCC decreases, the speed of response of the detector 90 decreases, and the level regulation of the boosted potential VPP becomes large.

The threshold voltage Vthn of the N-channel MOS transistor has negative temperature dependency. The threshold voltage Vthn decreases at high temperature and increases at low temperature. In order to make the N-channel MOS transistor 97 in the inverter 103 conductive, it is therefore necessary to set the level of the signal φC to 2×Vthn or higher. However, since the threshold voltage Vthn increases at low temperature, the operation margin under the condition of a low power supply voltage is slim.

SUMMARY OF THE INVENTION

It is therefore an object of the invention to provide a detector capable of assuring an operation margin under the conditions of a low temperature and a low voltage.

In a potential detecting circuit according to the invention, an inverter for outputting an inversion signal of an output signal of a comparator includes: a first transistor of a first conduction type connected between a line of a first power supply potential and an output node, having an input electrode for receiving an output signal of the comparator; a second transistor of a second conduction type having a first electrode connected to the output node and an input electrode for receiving an output signal of the comparator; and a third transistor of the second conduction type connected between a second electrode of the second transistor and a line of a second power supply potential, having an input electrode for receiving a predetermined first potential different from a potential of the second electrode of the second transistor. Therefore, the potential of the second electrode of the second transistor can be set to be lower than a threshold potential of the third transistor. Thus, the operation margin under the conditions of a low voltage and a low temperature is made wider than that in the conventional technique.

Preferably, the comparator includes: fourth and fifth transistors of the first conduction type, the fourth transistor being connected between the line of the first power supply potential and a first node, the fifth transistor being connected between the line of the first power supply potential and a second node, each transistor having an input electrode connected to the first node; sixth and seventh transistors of the second conduction type, the sixth transistor being connected between the first and third nodes and having an input electrode for receiving the reference potential, and the seventh transistor being connected between the second node and the third node and having an input electrode for receiving the potential at the predetermined node; and an eighth transistor of the second conduction type connected between the third node and the line of the second power supply potential, having an input electrode for receiving a predetermined second potential, and the signal of the first or second level is outputted from the second node. In this case, the speed of response of the comparator depends on the second potential.

Preferably, the first potential is the first power supply potential. In this case, the speed of response of the inverter can be set high.

Preferably, the first potential is a constant potential between the first and second power supply potentials. In this case, the dependency of the speed of response of the inverter on the power supply voltage can be reduced.

Preferably, the constant potential is the reference potential. In this case, it is unnecessary to separately generate the first potential, so that the configuration can be simplified.

Preferably, the second potential is the first power supply potential. In this case, the speed of response of the comparator can be set high.

Preferably, the second potential is a constant potential between the first and second power supply potentials. In this case, the dependency of the speed of response of the comparator on the power supply voltage can be reduced.

Preferably, the constant potential is the reference potential. In this case, it is unnecessary to separately generate the second potential, so that the configuration can be simplified.

Preferably, each of the first and second potentials is the reference potential, and the circuit is further provided with: a reference potential generating circuit for generating the reference potential; a first buffer for transmitting the reference potential generated by the reference potential generating circuit to the input electrode in the sixth transistor; and a second buffer for transmitting the reference potential generated by the reference potential generating circuit to the input electrodes in the third and eighth transistors. In this case, it can be prevented that noises occurring in the input electrodes of the third and eighth transistors enter the input electrode of the sixth transistor to thereby cause an erroneous operation in the comparator.

Preferably, each of the first and second potentials is a constant potential between the first and second power supply potentials, and a threshold voltage of each of the second, sixth, and seventh transistors is set to be lower than a threshold voltage of each of the third and eighth transistors. In this case, deterioration in sensitivity of the potential detecting circuit caused by setting the first and second potentials as constant potentials can be prevented.

Preferably, each of the first and second potentials is a constant potential between the first and second power supply potentials, and a threshold voltage of each of the third and eighth transistors is set to be lower than a threshold voltage of each of the second, sixth, and seventh transistors. In this case, reduction in speed of response of the potential detecting circuit caused by setting the first and second potentials as constant potentials can be prevented.

Preferably, an amplifying circuit for amplifying a potential difference between the potential at the predetermined node and the reference potential and applying the resultant potential across the input electrodes of the sixth and seventh transistors is further provided. In this case, even when the potential difference between the first power supply potential and the potential at the predetermined node and that between the first power supply potential and the reference potential are reduced, the comparator operates normally. Thus, the operation margin of the comparator in the lower limit range of the power supply voltage can be widened.

Preferably, a level shifting circuit for level-shifting the potential at the predetermined node to the second power supply potential side and applying the resultant potential to the input electrode of the sixth transistor, and level-shifting the potential at the reference potential to the second power supply potential side and applying the resultant potential to the input electrode of the seventh transistor is further provided. In this case as well, even when the potential difference between the first power supply potential and the potential at the predetermined node and that between the first power supply potential and the reference potential are reduced, the comparator operates normally. Thus, the operation margin of the comparator in the lower limit range of the power supply voltage can be widened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
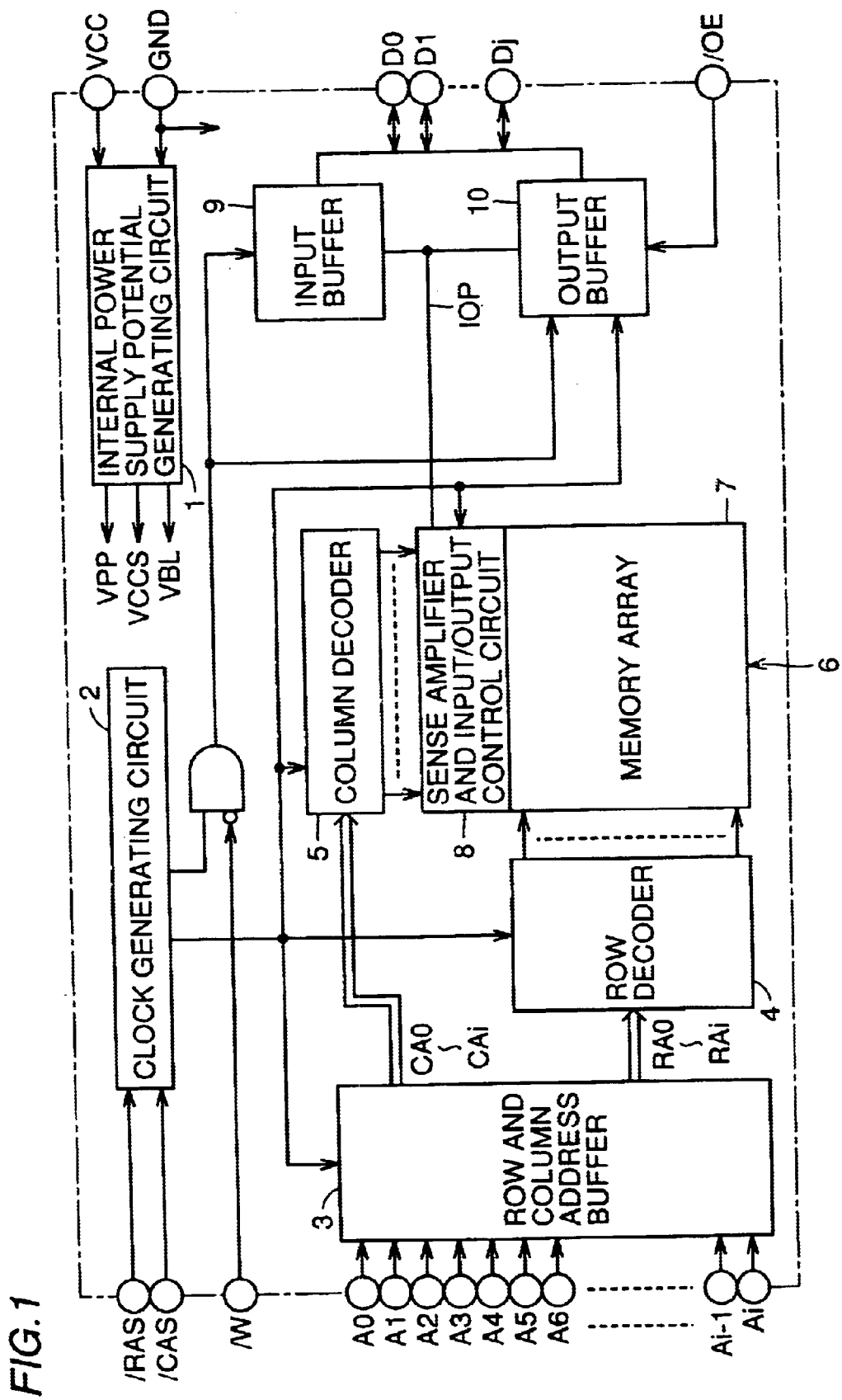
FIG. 1 is a block diagram showing a whole configuration of a DRAM according to an embodiment of the invention.

FIG. 1 is a block diagram showing the configuration of a DRAM according to an embodiment of the invention. In FIG. 1, this DRAM includes an internal power supply potential generating circuit 1, a clock generating circuit 2, a row and column address buffer 3, a row decoder 4, a column decoder 5, a memory mat 6, an input buffer 9, and an output buffer 10. The memory mat 6 includes a memory array 7 and a sense amplifier and input/output control circuit 8.

The internal power supply potential generating circuit 1 receives the power supply potential VCC and the ground potential GND from the outside and generates internal power supply potentials VPP, VCCS, and VBL. The clock generating circuit 2 selects a predetermined operation mode on the basis of signals /RAS and /CAS supplied from the outside and controls the entire DRAM.

The row and column address buffer 3 generates row address signals RA0 to RAi and column address signals CA0 to CAi on the basis of address signals A0 to Ai (where, i is an integer equal to or larger than zero) supplied from the outside, and supplies the generated signals RA0 to RAi and CA0 to CAi to the row decoder 4 and the column decoder 5, respectively.

The memory array 7 includes a plurality of memory cells each for storing 1-bit data, which are arranged in a matrix. Each memory cell is disposed in a predetermined address determined by a row address and a column address.

The row decoder 4 designates a row address in the memory array 7 in response to the row address signals RA0 to RAi supplied from the row and column address buffer 3. The column decoder 5 designates a column address in the memory array 7 in response to the column address signals CA0 to CAi supplied from the row and column address buffer 3. The sense amplifier and input/output control circuit 8 connects the memory cell in the address designated by the row decoder 4 and the column decoder 5 to one end of a data input/output line pair IOP. The other end of the data input/output line pair IOP is connected to the input buffer 9 and the output buffer 10.

In the writing mode, in response to a signal /W supplied from the outside, the input buffer 9 supplies data Dj (where j is a natural number) entered from the outside to the selected memory cell via the data input/output line pair IOP. In the reading mode, in response to a signal /OE supplied from the outside, the output buffer 10 outputs read data Qj from the selected memory cell to the outside.

Figure 2:
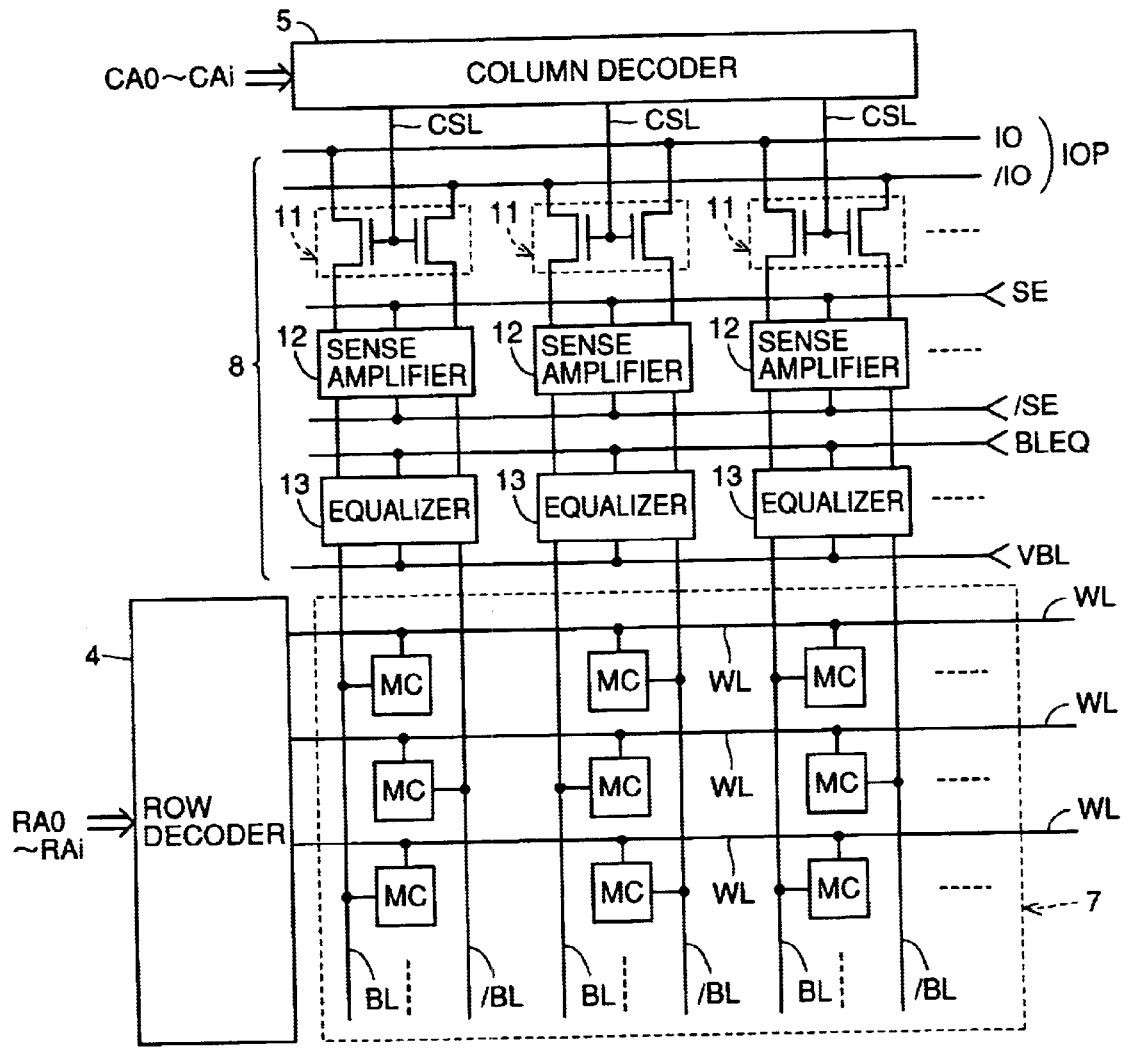
FIG. 2 is a circuit block diagram showing the configuration of a memory mat illustrated in FIG. 1.

FIG. 2 is a circuit block diagram showing the configuration of the memory mat 6 in the DRAM illustrated in FIG. 1. In FIG. 2, the memory array 7 includes a plurality of memory cells MC arranged in a matrix, word lines WL provided in correspondence with rows, and a pair of bit lines BL and /BL provided in correspondence with columns. Each of the memory cells MC is a known one including an N-channel MOS transistor for access and a capacitor for storing information. The word line WL transmits an output of the row decoder 4 to activate the memory cell MC in the selected row. The pair of bit lines BL and /BL receives/transmits a data signal to/from the selected memory cell MC.

The sense amplifier and input/output control circuit 8 includes a pair of data input/output lines 10 and /IO (IOP), and a column selection gate 11, a sense amplifier 12, and an equalizer 13 which are provided for each column. The column selection gate 11 includes a pair of N-channel MOS transistors connected between the pair of bit lines BL and /BL and the pair of data input/output lines IO and /10. The gates of the pair of N-channel MOS transistors of each of the column selection gates 11 are connected to the column decoder 5 via a column selection line CSL. When the column selection line CSL is raised to the "H" level as a selection level in the column decoder 5, the pair of N-channel MOS transistors are made conductive, and the pair of bit lines BL and /BL and the pair of data input/output lines IO and /IO are coupled to each other.

When a sense amplifier activating signal SE rises to the "H" level and a sense amplifier activating signal /SE decreases to the "L" level, in response to this, the sense amplifier 12 amplifies a small potential difference between the pair of bit lines BL and /BL to an internal power supply voltage VCCS (<VCC). When a bit line equalizing signal BLEQ rises to the "H" level as an activation level, in response to this, the equalizer 13 equalizes the potential of the pair of bit lines BL and /BL to a bit line potential VBL (=VCCS/2).

The operation of the DRAM shown in FIGS. 1 and 2 will now be described. In the writing mode, the column selection line CSL of a column according to the column address signals CA0 to CAi is increased to the "H" level as a selection level by the column decoder 5, and each of the column selection gates 11 is made conductive.

In response to the signal /W, the input buffer 9 supplies the write data Dj from the outside to the pair of bit lines BL and /BL in the column selected via the pair IOP of input/output lines. The write data Dj is supplied as a potential difference between the pair of bit lines BL and /BL. Subsequently, the level of the word line WL in the row according to the row address signals RA0 to RAi is raised to the "H" level as the selection level (boosted potential VPP, VPP>VCC) in the row decoder 4, and the N-channel MOS transistor in the memory cell MC in the row is made conductive. Charges of an amount corresponding to the potential of the bit line BL or /BL are accumulated in the capacitor in the selected memory cell MC.

In the reading mode, first, the bit line equalizing signal BLEQ goes down to the "L" level and the equalizing operation on the pair of bit lines BL and /BL is stopped. The word line WL in the row corresponding to the row address signals RA0 to RAi is raised to the "H" level as a selection level by the row decoder 4, and the N-channel MOS transistor in the memory cell MC in the row is made conductive. It makes the potential of the bit lines BL and /BL change only by a small amount in accordance with the charge amount of the capacitor in the memory cell MC activated.

Subsequently, the sense amplifier activating signals SE and /SE become at the "H" level and the "L" level, respectively, thereby activating the sense amplifier 12. When the potential of the bit line BL is higher than that of the bit line /BL only by a small amount, the potential of the bit line BL is raised to the "H" level (internal power supply potential VCCS), and the potential of the bit line /BL is lowered to the "L" level (ground potential GND). On the contrary, when the potential of the bit line /BL is higher than that of the bit line BL only by a small amount, the potential of the bit line /BL is raised to the "H" level and the potential of the bit line BL is lowered to the "L" level.

Subsequently, the column selection line CSL of the column corresponding to the column address signals CA0 to CAi is raised to the "H" level as a selection level by the column decoder 5, and the column selection gate 11 in the column is made conductive. The data of the pair of bit lines BL and /BL of the selected column is supplied to the output buffer 10 via the column selection gate 11 and the pair of data input/output lines IO and /IO. The output buffer 10 outputs the read data Qj to the outside in response to the signal /OE.

Figure 3:
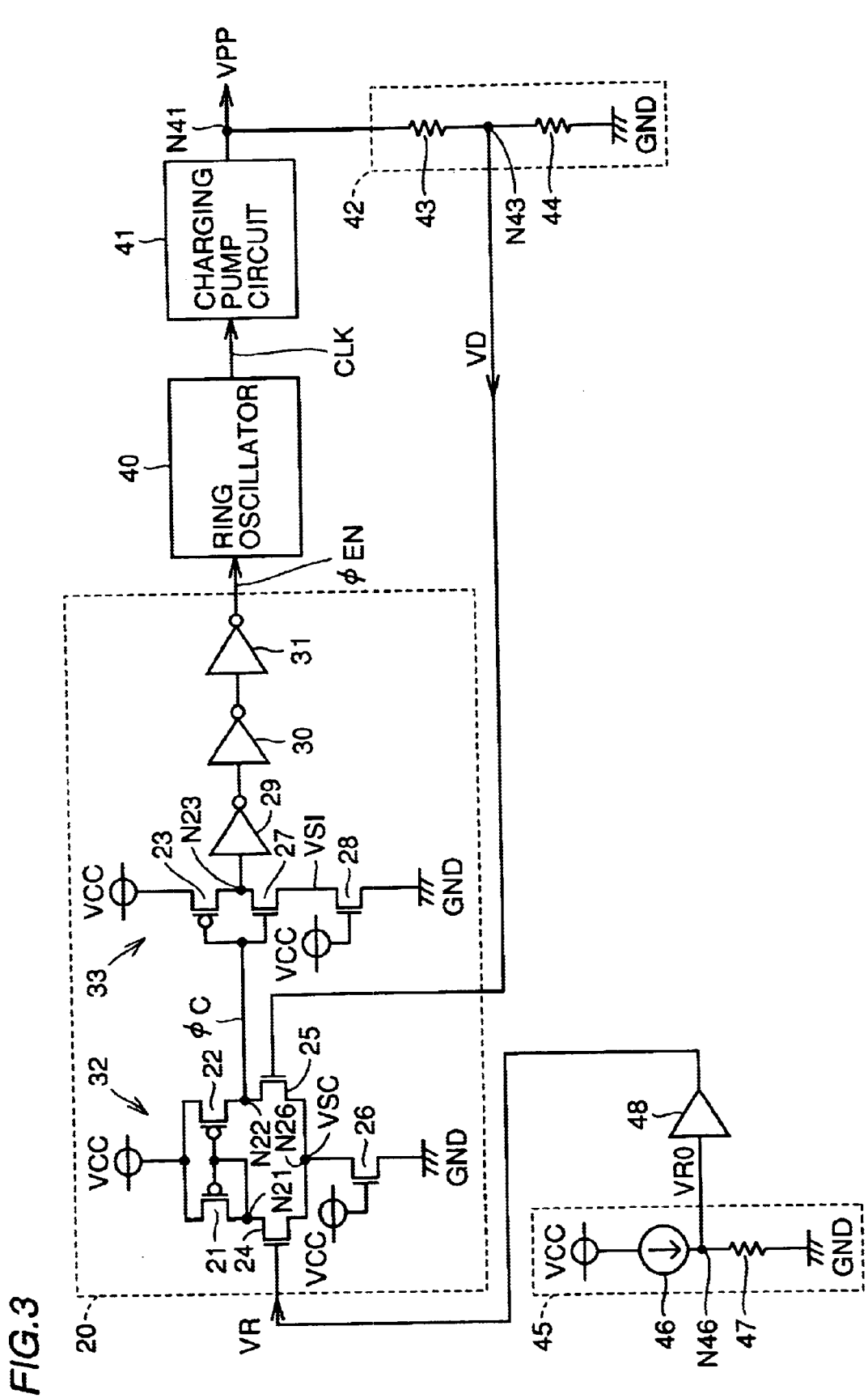
FIG. 3 is a circuit block diagram showing the configuration of a VPP generating circuit included in an internal power supply potential generating circuit illustrated in FIG. 1.

As described above, in the DRAM, the various internal power supply potentials VPP, VCCS, and VBL are generated on the basis of the external power supply potential VCC. FIG. 3 is a circuit block diagram showing the configuration of the VPP generating circuit included in the internal power supply potential generating circuit 1 in FIG. 1.

In FIG. 3, the VPP generating circuit includes a detector 20, a ring oscillator 40, a charging pump circuit 41, a voltage dividing circuit 42, a reference potential generating circuit 45, and a buffer 48.

The detector 20 includes P-channel MOS transistors 21 to 23, N-channel MOS transistors 24 to 28, and inverters 29 to 31. The P-channel MOS transistors 21 and 22 and the N-channel MOS transistors 24 to 26 construct a comparator 32. The P-channel MOS transistors 21 and 22 are connected between the line of the external power supply potential VCC and nodes N21 and N22, respectively. The gates of the P-channel MOS transistors 21 and 22 are connected to the node N21. The P-channel MOS transistors 21 and 22 construct a current mirror circuit. A signal appearing at the node N22 is an output signal $\phi C$ of the comparator 32. The N-channel MOS transistor 24 is connected between the node N21 and a node N26, and the N-channel MOS transistor 25 is connected between the node N22 and the node N26. The gates of the N-channel MOS transistors 24 and 25 receive a reference potential VR and a partial potential VD, respectively. The N-channel MOS transistor 26 is connected between the node N26 and a line of the ground potential GND and its gate receives the external power supply potential VCC. The N-channel MOS transistor 26 serves as a resistive element.

A current of the value according to the reference potential VR is passed to the N-channel MOS transistor 24. Since the MOS transistors 21 and 24 are connected in series and the MOS transistors 21 and 22 construct a current mirror circuit, the current of the same value is passed to the MOS transistors 21, 22, and 24. A current of the value according to the partial potential VD is passed to the N-channel MOS transistor 25. When the partial potential VD is higher than the reference potential VR, a current passing through the N-channel MOS transistor 25 becomes larger than a current passing through the MOS transistors 21, 22, and 24, and the signal $\phi C$ decreases to the "L" level (potential VSC at the node N26). When the partial potential VD is lower than the reference potential VR, the current passing through the N-channel MOS transistor 25 becomes smaller than the current passing through the MOS transistors 21, 22, and 24, and the signal $\phi C$ becomes the "H" level (external power supply potential VCC).

The P-channel MOS transistor 23 and the N-channel MOS transistors 27 and 28 construct an inverter 33. The MOS transistors 23, 27, and 28 are connected in series between the line of the external power supply potential VCC and the line of the ground potential GND. Each of the gates of the MOS transistors 23 and 27 receives the output signal $\phi C$ of the comparator 32. The drains of the MOS transistors 23 and 27 serve as an output node N23 of the inverter 33. The gate of the N-channel MOS transistor 28 receives the external power supply potential VCC. The N-channel MOS transistor 28 serves as a resistive element. The threshold voltage of the inverter 33 is set to an intermediate level between the potential VSC at the node N26 of the comparator 32 and the external power supply potential VCC.

When the output signal $\phi C$ of the comparator 30 is at the "H" level, the P-channel MOS transistor 23 is nonconductive, the N-channel MOS transistor 27 is conductive, and the node N23 is at the "L" level. When the signal $\phi C$ is at the "L" level, the P-channel MOS transistor 23 is conductive, the N-channel MOS transistor 27 is nonconductive, and the node N23 is at the "H" level. In a standby state where consumption of the boosted potential VPP is small, the boosted potential VPP changes gently, so that the level of the output signal $\phi C$ of the comparator 32 also changes gently between the "H" and "L" levels. Therefore, both of the P-channel MOS transistor 23 and the N-channel MOS transistor 27 in the inverter 33 are made conductive and a through current flows. The through current is regulated by the N-channel MOS transistor 28. A signal appearing at the node N23 is inverted by the inverters 29 to 31 to become a signal $\phi EN$ of the detector 20. The signal $\phi EN$ is supplied to the ring oscillator 40.

Figure 4:
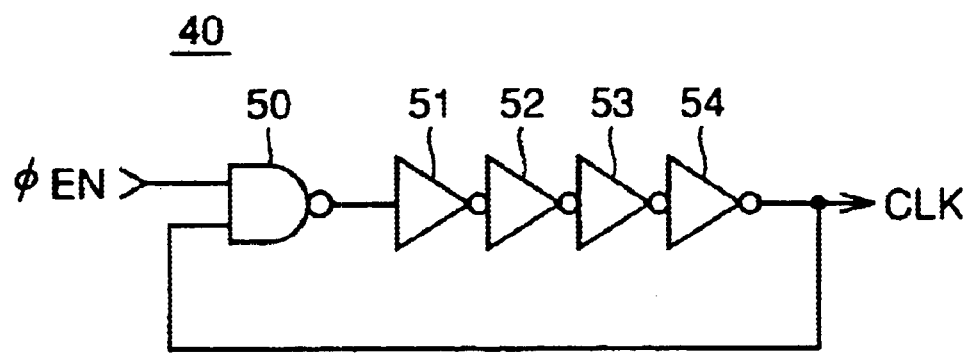
FIG. 4 is a circuit diagram showing the configuration of a ring oscillator illustrated in FIG. 3.

The ring oscillator 40 includes, as shown in FIG. 4, an NAND gate 50 and inverters 51 to 54 of even-number stages (four stages in the diagram). The inverters 51 to 54 are connected between the output node and one input node of the NAND gate 50. The other input node of the NAND gate 50 receives the output signal $\phi EN$ of the detector 20. An output clock signal of the inverter 54 is an output clock signal CLK of the ring oscillator 40.

When the signal $\phi EN$ is at the "H" level, the NAND gate 50 operates as an inverter on the clock signal CLK. The level of the clock signal CLK is inverted each time delay time of the NAND gate 50 and the inverters 51 to 54 elapses. When the signal $\phi EN$ is at the "L" level, the output signal of the NAND gate 50 is fixed at the "H" level and the clock signal CLK is also fixed at the "H" level. The clock signal CLK is supplied to the charging pump circuit 41.

Figure 5:
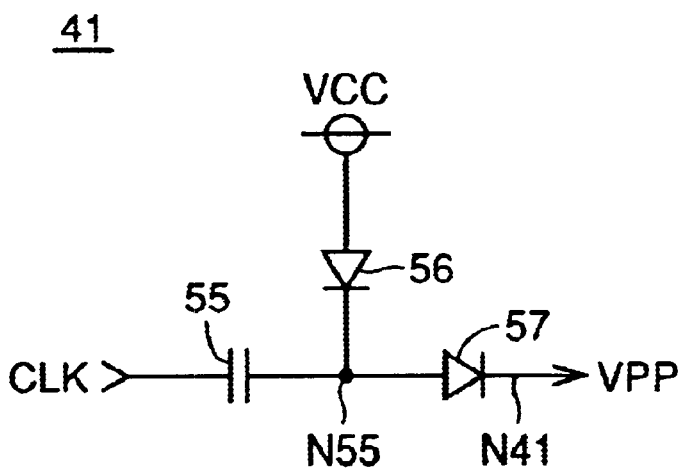
FIG. 5 is a circuit diagram showing the configuration of a charging pump circuit illustrated in FIG. 3.

The charging pump circuit 41 includes, as shown in FIG. 5, a capacitor 55 and diodes 56 and 57. One of the electrodes of the capacitor 55 receives the output clock signal CLK of the ring oscillator 40 and the other electrode is connected to a node N55. The diode 56 is connected between the line of the external power supply potential VCC and the node N55. The diode 57 is connected between the node N55 and a node N41 of the boosted potential VPP.

In a period where the clock signal CLK is at the "L" level (ground potential GND), a current flows from the line of the external power supply potential VCC to the node N55 via the diode 56, and the capacitor 55 is charged up to VCC-Vthd (where, Vthd is a threshold voltage of the diode). When the clock signal CLK is raised from the "L" level to the "H" level (external power supply potential VCC), the potential at the node N55 is raised to 2VCC-Vthd, and positive charges are supplied from the node N55 to the node N41 via the diode 57.

The voltage dividing circuit 42 includes resistive elements 43 and 44 connected in series between the node N41 of the boosted potential VPP and the line of the ground potential GND. When resistance values of the resistive elements 43 and 44 are set as R43 and R44, respectively, the potential VD at a node N43 between the resistive elements 43 and 44 is obtained by VD=VPP×R44/(R43+R44). The partial potential VD is supplied to the gate of the N-channel MOS transistor 25 in the comparator 32.

The reference potential generating circuit 45 includes a constant current source and a resistive element 47 connected in series between the line of the external power supply potential VCC and the line of the ground potential GND. When an output current of the constant current source 46 is set as I46 and a resistance value of the resistive element 47 is set as R47, a potential VR0 at a node N46 between the constant current source 46 and the resistive element 47 is obtained by VR0=I46×R47. The potential VR0 at the node N46 is supplied to the buffer 48, and an output potential of the buffer 48 is supplied as a reference potential VR (=VR0) to the gate of the N-channel MOS transistor 24 in the comparator 32. The resistance values R43, R44, and R47 of the resistive elements 43, 44, and 47 and the current value I46 of the constant current source 46 are set so that the partial potential VD reaches the reference potential VR when the boosted potential VPP reaches the target potential.

The operation of the VPP generating circuit will now be described. In an initial state, the boosted potential VPP is sufficiently lower than the target potential, so that the partial potential VD is lower than the reference potential VR, and the output signal φC of the comparator 32 is at the "H" levelConsequently, the output node N23 in the inverter 33 is at the "L" level, and the output signal φEN of the detector 20 is at the "H" level. The ring oscillator 40 is activated to generate the clock signal CLK, and the charging pump circuit 41 is driven by the clock signal CLK. Each time the clock signal CLK is raised from the "L" level to the "H" level, positive charges are supplied from the charging pump circuit 41 to the node N41 to increase the potential VPP at the node N41.

When the boosted potential VPP exceeds the target potential, the partial potential VD exceeds the reference potential VR and the output signal φC of the comparator 32 goes low to the "L" level. The output node N23 of the inverter 33 increases to the "H" level, the output signal φEN of the detector 20 decreases to the "L" level, the ring oscillator 40 is made inactive, and the driving of the charging pump circuit 41 is stopped. When the boosted potential VPP is used and drops below the target potential, the output signal φEN of the detector 20 rises to the "H" level, the ring oscillator 40 is made active, and positive charges are supplied again from the charging pump circuit 41 to the node N41. The boosted potential VPP is therefore held at the target potential.

In the embodiment, the threshold potential of the inverter 33 is adjusted and the through current of the inverter 33 is regulated by the N-channel MOS transistor 28 which receives the external power supply potential VCC at its gate. Therefore, since the potential VSI of the drain of the N-channel MOS transistor 28 can be set equal to or lower than the threshold potential Vthn of the N-channel MOS transistor 28, the operation margin of the inverter 33 at the time of a low voltage and a low temperature can be made wider as compared with a conventional technique.

Since the external power supply potential VCC is applied to the gates of the N-channel MOS transistors 26 and 28, when the external power supply potential VCC fluctuates, the potentials VSC and VSI of the drains of the N-channel MOS transistors 26 and 28 fluctuate in a manner similar to the external power supply potential VCC. When the external power supply potential VCC decreases and the drain potential VSC of the N-channel MOS transistor 26 increases, the drain potential VSI of the N-channel MOS transistor 28 also increases and the threshold potential of the inverter 33 also increases. Thus, the operation margin of the inverter 33 when the external power supply potential VCC fluctuates can be widened.

Figure 6:
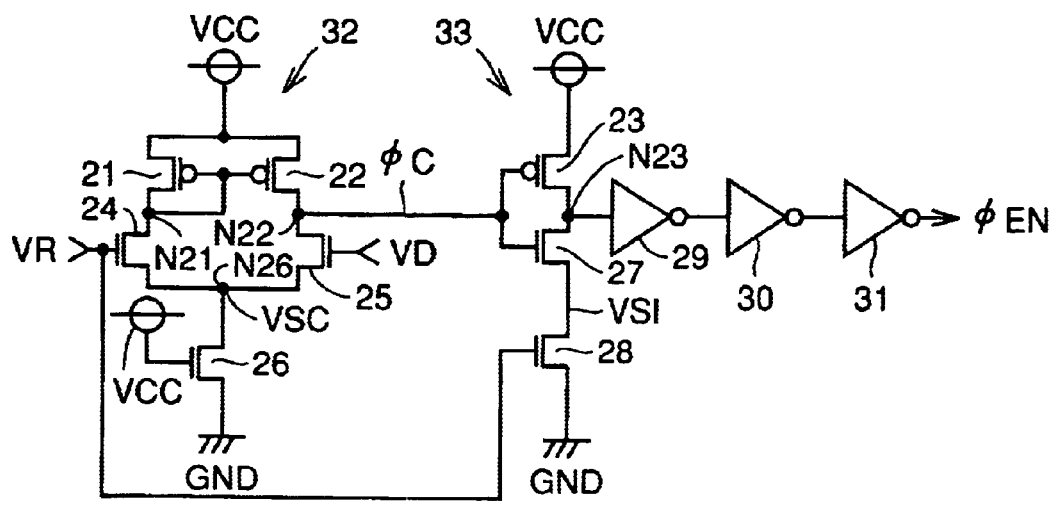
FIG. 6 is a circuit diagram showing a modification of the embodiment.

Modifications of the foregoing embodiment will now be described hereinbelow. In a modification of FIG. 6, the reference potential VR is applied in place of the external power supply potential VCC to the gate of the N-channel MOS transistor 28 in the inverter 33. In the modification as well, the through current of the inverter 33 can be regulated by the N-channel MOS transistor 28, and the operation margin under the conditions of a low voltage and a low temperature can be assured. Since the reference potential VR does not fluctuate even when the external power supply potential VCC fluctuates, the VCC dependency of the through current of the inverter 33 can be suppressed, and the VCC dependency of the speed of response of the inverter 33 and the like can be suppressed. Since VR is smaller than VCC (VR<VCC), the channel length of the N-channel MOS transistor 28 can be shortened as compared with that in the circuit of FIG. 3, so that the circuit area can be narrowed.

Figure 7:
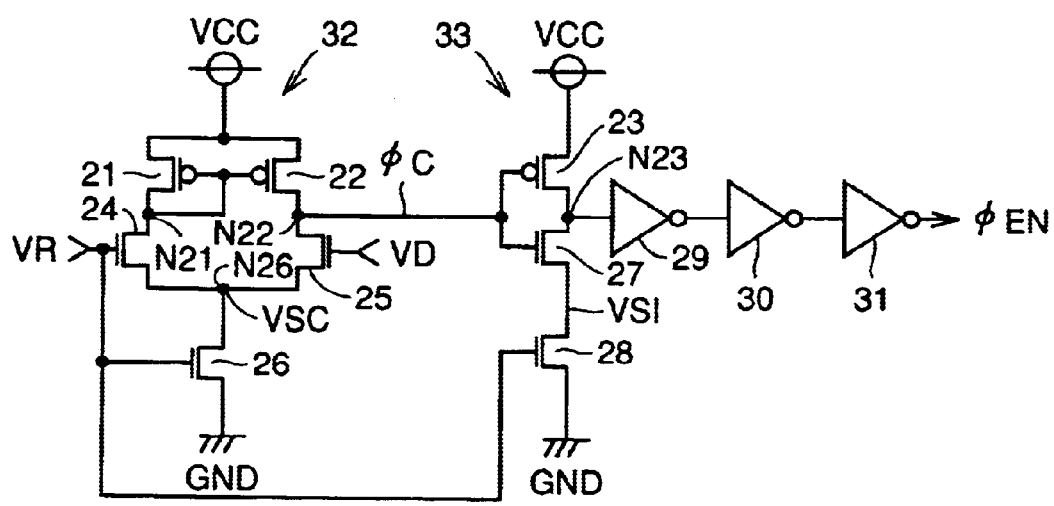
FIG. 7 is a circuit diagram showing another modification of the embodiment.

In a modification of FIG. 7, the reference potential VR is applied not only to the N-channel MOS transistor 28 in the inverter 33 but also to the gate of the N-channel MOS transistor 26 in the comparator 32. Consequently, the VCC dependency of the through current of the comparator 30 can be suppressed, and the VCC dependency of the speed of response of the detector can be suppressed.

Figure 8:
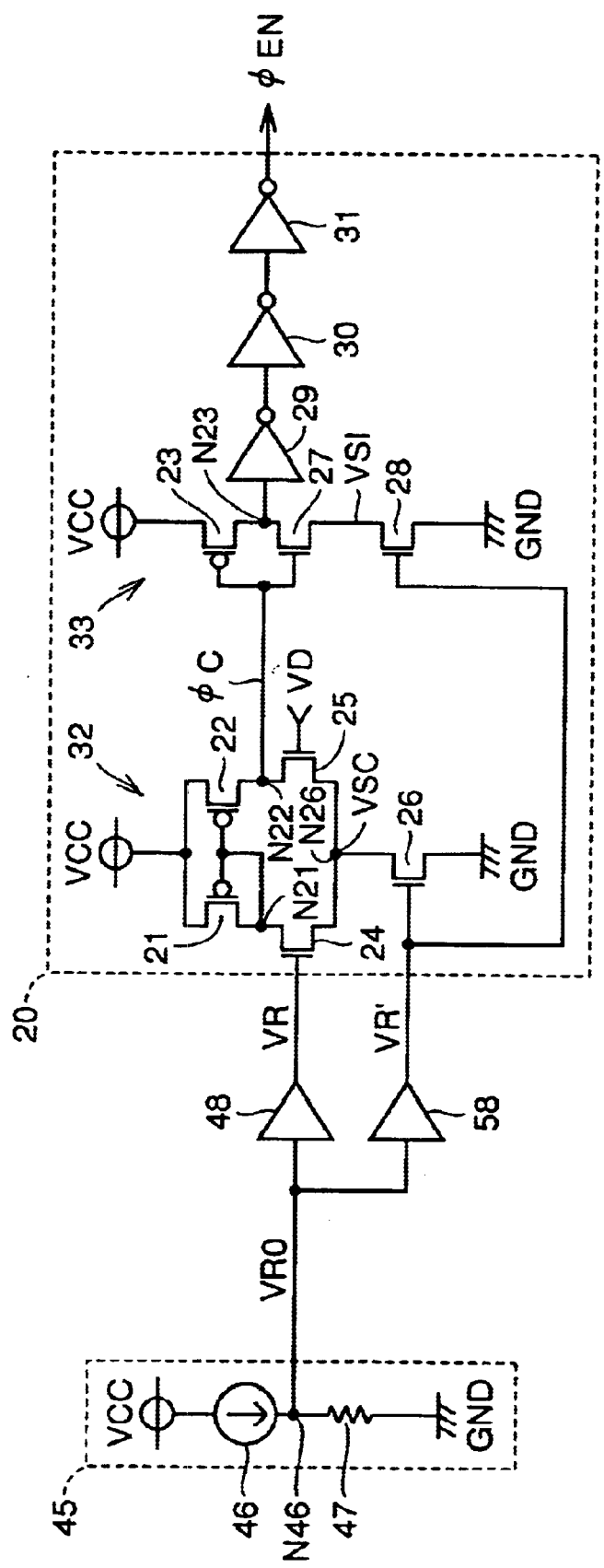
FIG. 8 is a circuit diagram showing further another modification of the embodiment.

In the modification of FIG. 7, the output potential VR of the buffer 48 is applied to the N-channel MOS transistors 24, 26, and 28. However, since a relatively large current is passed to the N-channel MOS transistors 26 and 28, there is the possibility such that noises occur in the reference potential VR and are supplied to the gate of the N-channel MOS transistor 24, and it causes an erroneous operation of the comparator 32. In a modification of FIG. 8, therefore, a buffer 58 is added. The output potential VR0 of the reference potential generating circuit 45 is supplied to the buffers 48 and 58. The output potential of the buffer 48 is supplied as a reference potential VR (=VR0) to the gate of the N-channel MOS transistor 24, and the output potential of the buffer 58 is supplied as a reference potential VR'(=VR0) to the gates of the N-channel MOS transistors 26 and 28. In the modification, therefore, it can be prevented that noises occurring in the gates of the N-channel MOS transistors 26 and 28 are transmitted to the gate of the N-channel MOS transistor 24 to cause an erroneous operation of the comparator 32.

Figure 9:
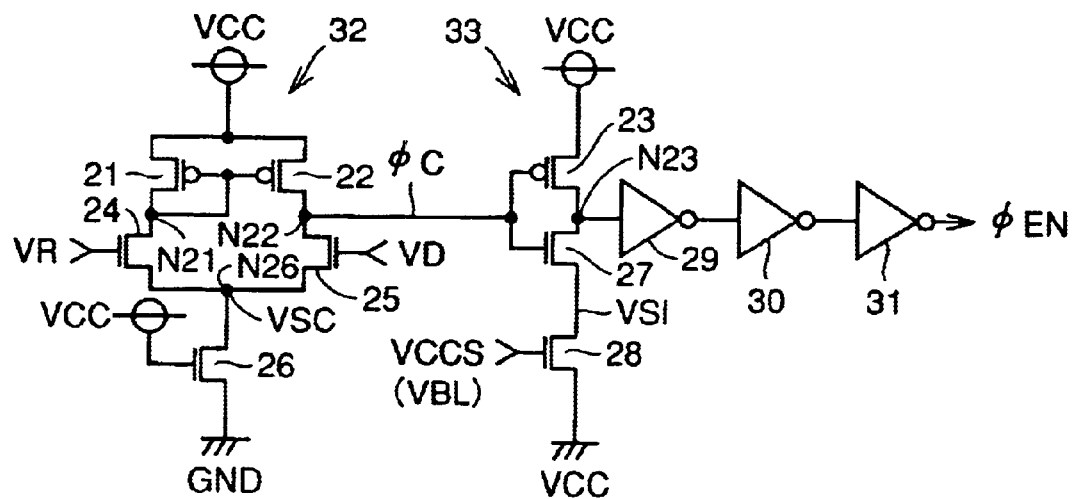
FIG. 9 is a circuit diagram showing further another modification of the embodiment.

In a modification of FIG. 9, in place of the external power supply potential VCC, the internal power supply potential VCCS (<VCC) or the bit line potential VBL (=VCCS/2) for driving the sense amplifier 12 is applied to the gate of the N-channel MOS transistor 28 in the inverter 33. The internal power supply potential VCCS has a driving ability of about a few mA and is a stable potential which is not influenced by fluctuations in the external power supply potential VCC and an operation of the detector 20. In the modification, therefore, the VCC dependency of the through current of the inverter 33 can be suppressed, and the VCC dependency of the speed of response of the detector can be suppressed.

Figure 10:
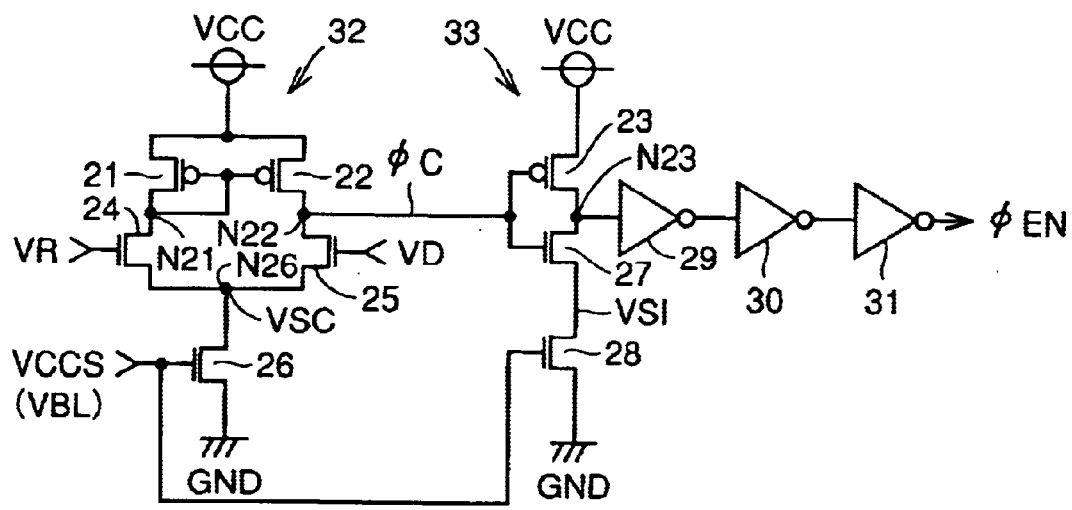
FIG. 10 is a circuit diagram showing further another modification of the embodiment.

In a modification of FIG. 10, the internal power supply potential VCCS (or bit line potential VBL) is applied not only to the gate of the N-channel MOS transistor 28 in the inverter 33 but also to the gate of the N-channel MOS transistor 26 in the comparator 32. In this case, the VCC dependency of the speed of response of the detector can be suppressed more.

Figure 11:
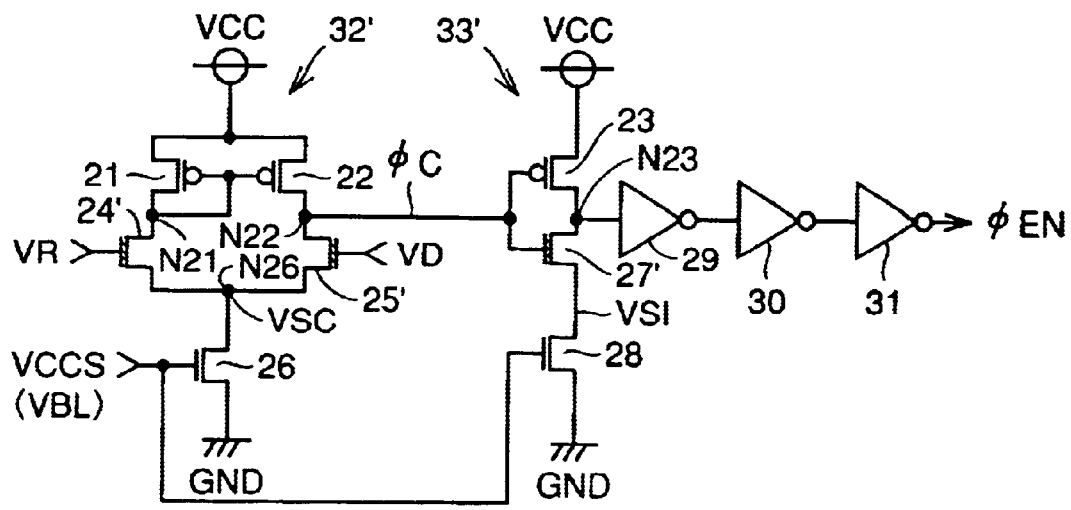
FIG. 11 is a circuit diagram showing further another modification of the embodiment.

When the internal power supply potential VCCS (or bit line potential VBL) is applied to the gates of the N-channel MOS transistors 26 and 28, as compared with the case where the external power supply potential VCC is applied to the gates of the N-channel MOS transistors 26 and 28, the source potentials VSC and VSI of the N-channel MOS transistors 24, 25, and 27 rise, the voltage between the substrate and the source of each of the N-channel MOS transistors 24, 25, and 27 increases, and the threshold voltage of each of the N-channel MOS transistors 24, 25, and 27 increases. When the threshold voltage of each of the N-channel MOS transistors 24, 25, and 27 increases, the sensitivity of the detector deteriorates. In a modification of FIG. 11, consequently, the N-channel MOS transistors 24, 25, and 27 are replaced by N-channel MOS transistors 24', 25', and 27' each having a low threshold voltage, thereby preventing the sensitivity of the detector from deteriorating. By forming the gate oxide film of each of the N-channel MOS transistors 24', 25', and 27' so as to be thinner than that in each of the N-channel MOS transistors 24, 25, and 27, the threshold voltage of each of the N-channel MOS transistors 24', 25', and 27' can be made lower than that of each of the N-channel MOS transistors 24, 25, and 27.

Figure 12:
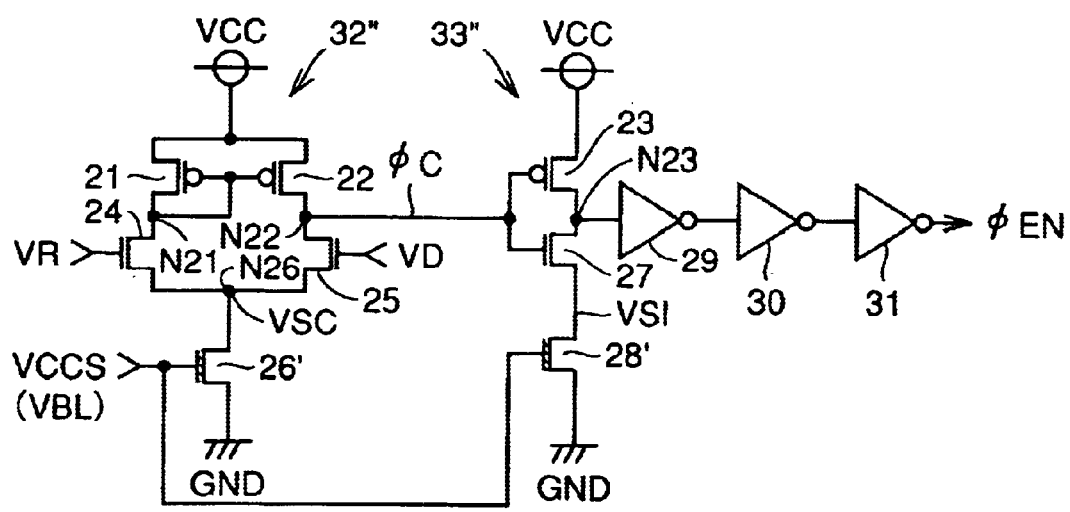
FIG. 12 is a circuit diagram showing further another modification of the embodiment.

When the internal power supply potential VCCS (or bit line potential VBL) is applied to the gates of the N-channel MOS transistors 26 and 28, as compared with the case where the external power supply potential VCC is applied to the gates of the N-channel MOS transistors 26 and 28, the through current passing through the N-channel MOS transistors 26 and 28 decreases, and the speed of response of the detector becomes slow. In a modification of FIG. 12, the N-channel MOS transistors 26 and 28 are replaced by N-channel MOS transistors 26' and 28' each having a low threshold voltage to thereby preventing the through current from decreasing and preventing the speed of response of data from being lowered.

When the external power supply potential VCC decreases and the potential difference between the external power supply potential VCC and the reference potential VR and the potential difference between the external power supply potential VCC and the partial potential VD are reduced, the current passing through the N-channel MOS transistors 24 and 25 decreases, and the speed of response of the comparator 32 is lowered. In a modification of FIGS. 13A and 13B, therefore, a differential amplifying circuit 60 is added. The differential amplifying circuit 60 includes N-channel MOS transistors 61 to 65. The gate and drain of the N-channel MOS transistor 61 receive the external power supply potential VCC, and the source of the N-channel MOS transistor 61 is connected to a node N61. The N-channel MOS transistor 62 is connected between the node N61 and a node N62, and the N-channel MOS transistor 63 is connected between the node N61 and a node N63. The gates of the N-channel MOS transistors 62 and 63 receive the reference potential VR and the partial potential VD, respectively. The potentials at the nodes N62 and N63 are applied to the N-channel MOS transistors 24 and 25 of the comparator 32 in place of the reference potential VR and the partial potential VD. The N-channel MOS transistor 64 is connected between the node N62 and the line of the ground potential GND and the N-channel MOS transistor 65 is connected between the node N63 and the line of the ground potential GND. The gates of the N-channel MOS transistors 64 and 65 are connected to the node N63. The N-channel MOS transistors 64 and 65 construct a current mirror circuit.

A current of a value according to the reference potential VR is passed to the N-channel MOS transistor 62 and a current of a value according to the partial potential VD is passed to the N-channel MOS transistor 63. Since the N-channel MOS transistors 63 and 65 are connected in series and the N-channel MOS transistors 64 and 65 construct a current mirror circuit, currents of the same value are passed to the N-channel MOS transistors 63 to 65.

When the partial potential VD is lower than the reference potential VR, the current passing to the N-channel MOS transistor 62 becomes larger than that passing to the N-channel MOS transistors 63 to 65, the potential VRS at the node N62 rises to the "H" level and the potential VDS at the node N63 decreases to the "L" level. When the partial potential VD is higher than the reference potential VR, the current passing to the N-channel MOS transistor 62 becomes smaller than that passing to the N-channel MOS transistors 63 to 65, the potential VRS at the node N62 decreases to the "L" level, and the potential VDS at the node N63 increases to the "H" level. Consequently, even when the external power supply potential VCC drops, the potential difference between the external power supply potential VCC and each of the potentials VRS and VDS at the nodes N62 and N63 can be assured, and the speed of response of the comparator 32 can be prevented from being lowered. Thus, the operation margin of the comparator 32 in the lower limit range of the external power supply potential VCC is widened.

Figure 13A:
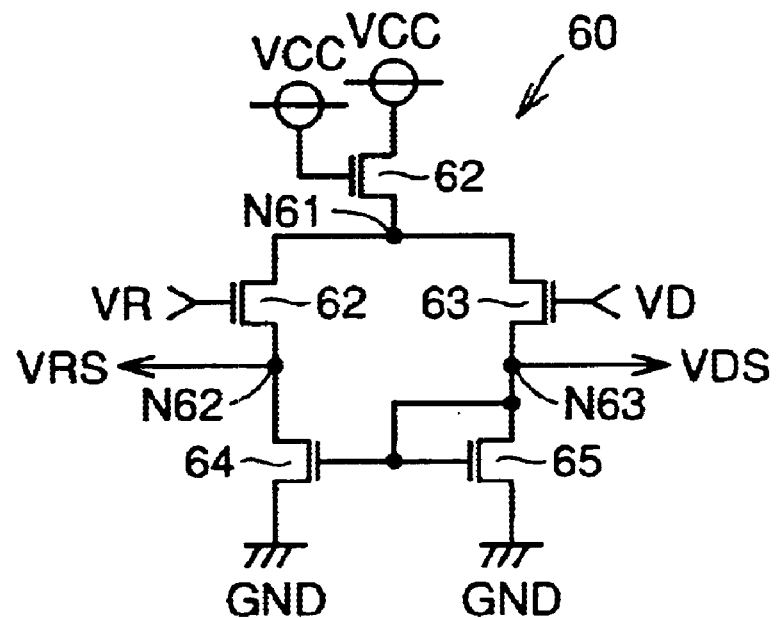
FIGS. 13A and 13B are circuit diagrams showing further another modification of the embodiment.
Figure 13B:
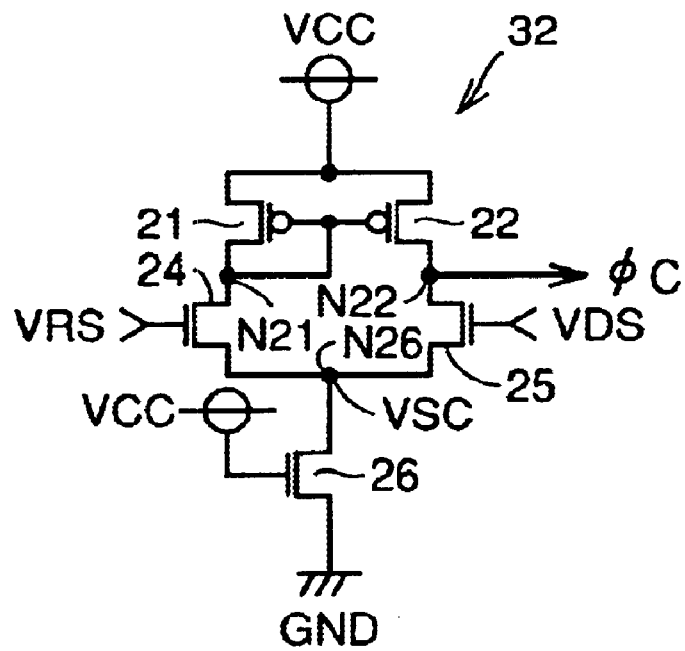
Figure 14:
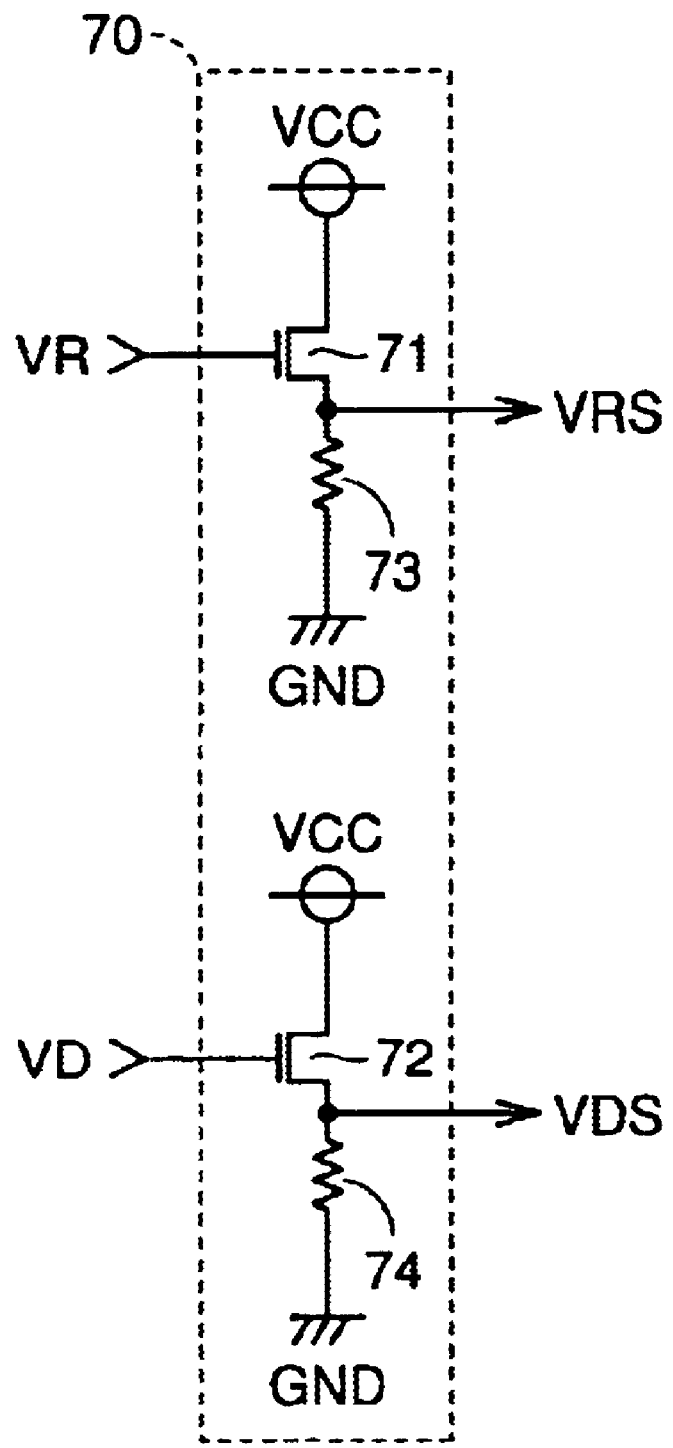
FIG. 14 is a circuit diagram showing further another modification of the embodiment.
Figure 15:
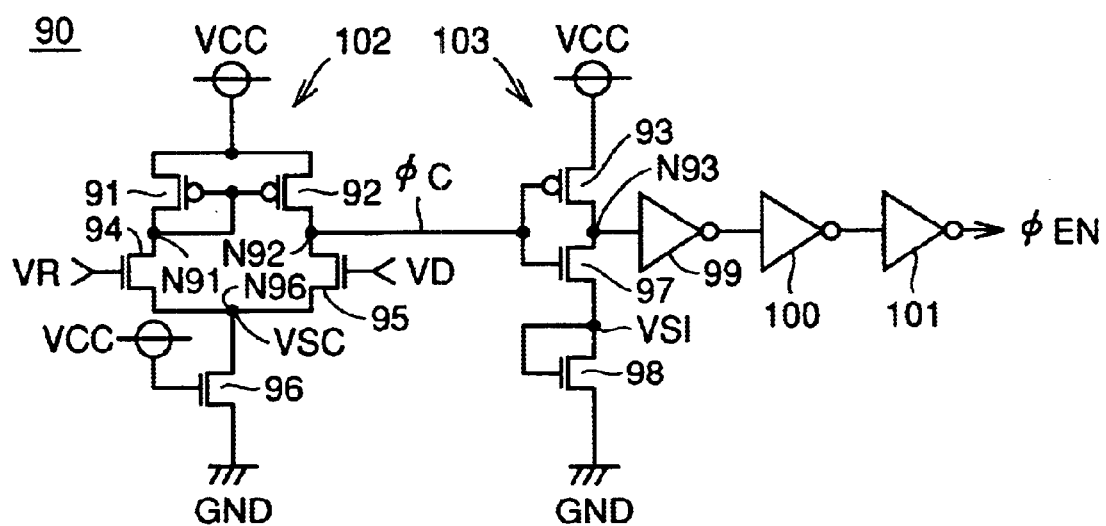
FIG. 15 is a circuit diagram showing the configuration of a detector included in a conventional VPP generating circuit.

In a modification of FIG. 14, the differential amplifying circuit 60 of the modification of FIGS. 13A and 13B is replaced by a level shifting circuit 70. The level shifting circuit 70 includes N-channel MOS transistors 71 and 72 and resistive elements 73 and 74. The N-channel MOS transistor 71 and the resistive element 73 are connected in series between the line of the external power supply potential VCC and the line of the ground potential GND. The N-channel MOS transistor 72 and the resistive element 74 are connected in series between the line of the external power supply potential VCC and the line of the ground potential GND. The gate of the N-channel MOS transistor 71 receives the reference potential VR, and the gate of the N-channel MOS transistor 72 receives the partial potential VD. The source potentials VRS and VDS of the N-channel MOS transistors 71 and 72 are applied to the gates of the N-channel MOS transistors 24 and 25 in the comparator 32 in place of the reference potential VR and the partial potential VD, respectively.

A current of a value according to the reference potential VR is passed to the N-channel MOS transistor 71, and a current of a value according to the partial potential VD is passed to the N-channel MOS transistor 72. The source potentials VRS and VDS of the N-channel MOS transistors 71 and 72 are therefore potentials level-shifted from the external power supply potential VCC to the ground potential GND side only by a voltage according to the reference potential VR and a voltage according to the partial potential VD, respectively. In the modification as well, the same effect as that of the modification of FIGS. 13A and 13B can be obtained.

Obviously, the embodiment and the various modifications may be combined as appropriate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for detecting whether a potential at a predetermined node is higher than a reference potential or not, comprising:

a potential detecting circuit;

a ring oscillator operating by receiving an output from said potential detecting circuit; and a charge pump circuit operating based on an output from the ring oscillator wherein a driving potential of said charge pump circuit is a first power supply potential, wherein the potential detecting circuit comprises:
- a first power supply potential node for receiving the first power supply potential;
- a second power supply potential node;
- a comparator for comparing the potential at said predetermined node with said reference potential and outputting a signal of first level or second level on the basis of a comparison result; and
- an inverter for receiving the output signal of said comparator and outputting an inversion signal of the output signal to an output node,
  wherein said inverter comprises:
  - a first transistor of a first conduction type connected between said first power supply potential node and said output node, having an input electrode for receiving the output signal of said comparator;
  - a second transistor of a second conduction type having a first electrode connected to said output node and an input electrode for receiving the output signal of said comparator; and
  - a third transistor of the second conduction type connected between a second electrode of said second transistor and said second power supply potential node, having an input electrode connected directly to said first power supply potential node, wherein said first power supply potential node supplies a potential different from a potential of the second electrode of said second transistor.

2. The semiconductor device according to claim 1, wherein said comparator comprises:
- fourth and fifth transistors of the first conduction type, the fourth transistor being connected between said first power supply potential node and a first node, the fifth transistor being connected between said first power supply potential node and a second node, each transistor having an input electrode connected to said first node;
- sixth and seventh transistors of the second conduction type, the sixth transistor being connected between said first and a third nodes and having an input electrode for receiving said reference potential, and the seventh transistor being connected between said second node and said third node and having an input electrode for receiving the potential at said predetermined node; and
- an eight transistor of the second conduction type connected between said third node and said second power supply potential node, having an input electrode for receiving a predetermined second potential, and
the signal of said first or second level is outputted from said second node.

3. The semiconductor device according to claim 2, wherein said predetermined second potential is said first power supply potential supplied by said first power supply potential node.

4. The semiconductor device according to claim 2, wherein said predetermined second potential is a constant potential between said first and second power supply potentials.

5. The semiconductor device according to claim 4, wherein said constant potential is said reference potential.

6. The semiconductor device according to claim 2, further including a level shifting circuit for level-shifting the potential at said predetermined node substantially to said potential of said second power supply potential node and applying the resultant potential to the input electrode of said seventh transistor, and level-shifting said reference potential substantially to a potential of said second power supply potential node and applying the resultant potential to the input electrode of said sixth transistor.

7. A semiconductor device comprising:
- a comparator for comparing the potential at a predetermined node with a reference potential and outputting a signal of first level or second level on the basis of a comparison result;
- an inverter for receiving the output signal of said comparator and outputting an inversion signal of the output signal to an output node;
  wherein said inverter comprises:
  - a first transistor of a first conduction type connected between a line of a first power supply potential and said output node, having an input electrode for receiving the output signal of said comparator;
  - a second transistor of a second conduction type having a first electrode connected to said output node and an input electrode for receiving the output signal of said comparator; and
  - a third transistor of the second conduction type connected between a second electrode of said second transistor and a line of a second power supply potential, having an input electrode for receiving a predetermined first potential different from a potential of the second electrode of said second transistor, wherein said predetermined first potential is said reference potential;
  wherein said comparator comprises:
  - fourth and fifth transistors of the first conduction type, the fourth transistor being connected between the line of said first power supply potential and a first node, the fifth transistor being connected between the line of said first power supply potential and a second node, each transistor having an input electrode connected to said first node;
  - sixth and seventh transistors of the second conduction type, the sixth transistor being connected between said first and a third nodes and having an input electrode for receiving said reference potential, and the seventh transistor being connected between said second node and said third node and having an input electrode for receiving the potential at said predetermined node; and
  - an eight transistor of the second conduction type connected between said third node and the line of said second power supply potential, having an input electrode for receiving a predetermined second potential, wherein said second potential is said reference potential, and
  the signal of said first or second level is outputted from said second node;
- a reference potential generating circuit for generating said reference potential;
- a first buffer for transmitting the reference potential generated by said reference potential generating circuit to the input electrode in said sixth transistor; and
- a second buffer for transmitting the reference potential generated by said reference potential generating circuit to the input electrodes in said third and eighth transistors.

8. A semiconductor device comprising:
a first power supply potential node;
a second power supply potential node;
a comparator for comparing the potential at a predetermined node with a reference potential and outputting a signal of first level or second level on the basis of a comparison result;
an inverter for receiving the output signal of said comparator and outputting an inversion signal of the output signal to an output node;
wherein said inverter comprises:
- a first transistor of a first conduction type connected between said first power supply potential node and said output node, having an input electrode for receiving the output signal of said comparator;
- a second transistor of a second conduction type, the second transistor structured with a threshold level in a first voltage range and having a first electrode connected to said output node and an input electrode for receiving the output signal of said comparator; and
- a third transistor of the second conduction type, the third transistor structured wit a threshold level in a second voltage range and connected between a second electrode of said second transistor and said second power supply potential node, having an input electrode for receiving a predetermined first potential different from a potential of the second electrode of said second transistor;

wherein said comparator comprises:
- fourth and fifth transistors of the first conduction type, the fourth transistor being connected between said first power supply potential node and a first node, the fifth transistor being connected between said first power supply potential node and a second node, each transistor having an input electrode connected to said first node;
- sixth and seventh transistors of the second conduction type, the sixth transistor structured with a threshold level in said first voltage range and connected between said first and a third nodes and having an input electrode for receiving said reference potential, and the seventh transistor structured with a threshold level in said first voltage range connected between said second node and said third node and having an input electrode for receiving the potential at said predetermined node;
- an eighth transistor of the second conduction type, the eighth transistor structured with a threshold level in said second voltage range and connected between said third node and said second power supply potential node, having an input electrode for receiving a predetermined second potential; and
- the signal of said first or second level is outputted from said second node;

wherein each of said predetermined first and second potentials is a constant potential between respective potentials supplied by said first and second power supply potential nodes,
wherein said first voltage range is set to be lower than said second voltage range.

9. The semiconductor device according to claim 8, wherein
a gate oxide film of each of said second, sixth and seventh transistors is set to be thinner than a gate oxide film of each of said third and eight transistors.

10. A semiconductor device comprising:
a first power supply potential node;
a second power supply potential node;
a comparator for comparing the potential at predetermined node with a reference potential and outputting a signal of first level or second level on the basis of a comparison result;
an inverter for receiving the output signal of said comparator and outputting an inversion signal of the output signal to an output node;
wherein said inverter comprises:
- a first transistor of a first conduction type connected between said first power supply potential and said output node, having an input electrode for receiving the output signal of said comparator;
- a second transistor of a second conduction type, the second transistor structured with a threshold level in a first voltage range and having a first electrode connected to said output node and an input electrode for receiving the output signal of said comparator; and
- a third transistor of the second conduction type, the third transistor structured with a threshold level in a second voltage range connected between a second electrode of said second transistor and said second power supply potential node, having an input electrode for receiving a predetermined first potential different from a potential of the second electrode of said second transistor;

wherein said comparator comprises:
- fourth and fifth transistors of the first conduction type, the fourth transistor being connected between said first power supply potential node and a first node, the fifth transistor being connected between said first power supply potential node and a second node, each transistor having an input electrode connected to said first node;
- sixth and seventh transistors of the second conduction type, the sixth transistor structured with a threshold level in said first voltage range and connected between said first and a third nodes and having an input electrode for receiving said reference potential, and the seventh transistor structured with a threshold level in said first voltage range connected between said second node and said third node and having an input electrode for receiving the potential at said predetermined node; and
- an eighth transistor of the second conduction type, the eighth transistor structured with a threshold in said second voltage range and connected between said third node and said second power supply potential node, having an input electrode for receiving a predetermined second potential; and
- the signal of said first or second level is outputted from said second node;

wherein each of said predetermined first and second potentials is a constant potential between respective potentials supplied by said first and second power supply potential nodes,
wherein said second voltage range is set to be lower than said first voltage range.

11. The semiconductor device according to claim 10, wherein
a gate oxide film of each of said third and eighth transistors is set to be thinner than a gate oxide fun of each of said second, sixth and seventh transistors.

12. A semiconductor device comprising:
a comparator for comparing potential at a predetermined node with a reference potential and outputting a signal of first level or second level on the basis of a comparison result;
an inverter for receiving the output signal of said comparator and outputting an inversion signal of the output signal to an output node;
wherein said inverter comprises:
a first transistor of a first conduction type connected between a line of a first power supply potential and said output node, having an input electrode for receiving the output signal of said comparator,
a second transistor of a second conduction type having a first electrode connected to said output node and an input electrode for receiving the output signal of said comparator, and
a third transistor of the second conduction type connected between a second electrode of said second transistor and a line of a second power supply potential, having an input electrode for receiving a predetermined first potential different from a potential of the second electrode of said second transistor;
wherein said comparator comprises:
fourth and fifth transistors of the first conduction type, the fourth transistor being connected between the line of said first power supply potential and a first node, the fifth transistor being connected between the line of said first power supply potential and a second node, each transistor having an input electrode connected to said first node;
sixth and seventh transistors of the second conduction type, the sixth transistor being connected between said first and a third nodes and having an input electrode for receiving a potential relative to said reference potential, and the seventh transistor being connected between said second node and said third node and having an input electrode for receiving another relative to the potential at said predetermined node; and
an eighth transistor of the second conduction type connected between said third node and the line of said second power supply potential, having an input electrode for receiving a predetermined second potential, and
the signal of said first or second level is outputted from said second node;
an amplifying circuit for amplifying a potential difference between the potential at said predetermined node and said reference potential and applying the resultant potentials across the input electrodes of said sixth and seventh transistors.

13. A semiconductor device for detecting whether a potential at a predetermined node is higher than a reference potential received at a reference potential node or not, comprising:
a potential detecting circuit;
a ring oscillator operating by receiving an output from said potential detecting circuit; and
a charge pump circuit operating based on an output from the ring oscillator,
wherein the potential detecting circuit comprises:
a comparator for comparing the potential at said predetermined node with said reference potential and outputting a signal of first level or second level on the basis of a comparison result; and
an inverter for receiving the output signal of said comparator and outputting an inversion signal of the output signal to an output node,
wherein said inverter comprises:
a first transistor of a first conduction type connected between a first power supply potential node and said output node, having an input electrode for receiving the output signal of said comparator;
a second transistor of a second conduction type having a first electrode connected to said output node and an input electrode for receiving the output signal of said comparator; and
a third transistor of the second conduction type connected between a second electrode of said second transistor and a second power supply potential node, having an input electrode connected directly to said reference potential node.

14. The semiconductor device according to claim 13, wherein said comparator comprises:
fourth and fifth transistors of the first conduction type, the fourth transistor being connected between said first power supply potential node and a first node, the fifth transistor being connected said first power supply potential node and a second node, each transistor having an input electrode connected to said first node;
sixth and seventh transistors of the second conduction type, the sixth transistor being connected between said first and a third nodes and having an input electrode for receiving said reference potential, and the seventh transistor being connected between said second node and said third node and having an input electrode for receiving the potential at said predetermined node; and
an eighth transistor of the second conduction type connected between said third node and said second power supply potential node, having an input electrode for receiving a predetermined second potential, and
the signal of said first or second level is outputted from said second node.

15. The semiconductor device according to claim 14, wherein said predetermined second potential is said potential supplied by said first power supply potential node.

16. The semiconductor device according to claim 14, wherein said predetermined second potential is a constant potential between said first and second power supply potentials.

17. The semiconductor device according to claim 16, wherein said constant potential is said reference potential.

18. The semiconductor device according to claim 14, further including a level shifting circuit for level-shifting the potential at said predetermined node substantially to a potential of said second power supply potential node and applying the resultant potential to the input electrode of said seventh transistor, and level-shifting said reference potential substantially to a potential of said second power supply potential node and applying the resultant potential to the input electrode of said sixth transistor.

* * * * *

UNITED STATES PATENT AND TRADEMARK OFFICE
CERTIFICATE OF CORRECTION

PATENT NO.   : 6,614,270 B2
DATED        : September 2, 2003
INVENTOR(S)  : Mako Okamoto et al.

It is certified that error appears in the above-identified patent and that said Letters Patent is hereby corrected as shown below:

<u>Title page, Item [54] and Column 1, lines 1-4,</u>
Title, change "POTENTIAL DETECTING CIRCUIT HAVING WIDE OPERATING MARGIN AND SEMICONDUCTOR DEVICE INCLUDING THE SAME" to -- SEMICONDUCTOR DEVICE INCLUDING POTENTIAL DETECTING CIRCUIT HAVING WIDE OPERATING MARGIN --

Signed and Sealed this

Twenty-third Day of March, 2004

JON W. DUDAS
*Acting Director of the United States Patent and Trademark Office*